(12) United States Patent
Tang et al.

(10) Patent No.: US 12,532,758 B2
(45) Date of Patent: Jan. 20, 2026

(54) BOARD-LEVEL PAD PATTERN FOR MULTI-ROW QFN PACKAGES

(71) Applicant: MEDIATEK INC., Hsin-Chu (TW)

(72) Inventors: Hui-Chi Tang, Hsinchu (TW); Shao-Chun Ho, Hsinchu (TW); Hsuan-Yi Lin, Hsinchu (TW); Pu-Shan Huang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 511 days.

(21) Appl. No.: 18/078,056

(22) Filed: Dec. 8, 2022

(65) Prior Publication Data

US 2023/0215798 A1 Jul. 6, 2023

Related U.S. Application Data

(60) Provisional application No. 63/296,011, filed on Jan. 3, 2022.

(51) Int. Cl.
*H01L 23/498* (2006.01)
*H01L 23/00* (2006.01)

(52) U.S. Cl.
CPC .. *H01L 23/49838* (2013.01); *H01L 23/49811* (2013.01); *H01L 24/32* (2013.01); *H01L 2224/32225* (2013.01)

(58) Field of Classification Search
None
See application file for complete search history.

(56) References Cited

U.S. PATENT DOCUMENTS

| | | | |
|---|---|---|---|
| 5,155,065 | A | 10/1992 | Schweiss |
| 5,468,999 | A | 11/1995 | Lin |
| 5,962,926 | A | 10/1999 | Torres |
| 6,091,089 | A | 7/2000 | Hiraga |
| 6,191,491 | B1 | 2/2001 | Hiraga |
| 6,603,199 | B1 | 8/2003 | Poddar |
| 6,700,208 | B1 | 3/2004 | Yoneda |
| 8,471,154 | B1 | 6/2013 | Yoshida |
| 8,723,337 | B2 | 5/2014 | Howard |
| 9,831,205 | B2 | 11/2017 | Chen |
| 10,231,325 | B1 | 3/2019 | Chengson |
| 11,173,714 | B1 | 11/2021 | Zhang |
| 11,450,633 | B2 | 9/2022 | Lin |
| 2002/0070451 | A1 | 6/2002 | Burnette |

(Continued)

FOREIGN PATENT DOCUMENTS

| | | |
|---|---|---|
| CN | 111668185 A | 9/2020 |
| CN | 212064501 U | 12/2020 |

(Continued)

OTHER PUBLICATIONS

TW I741898 B (Translation) (Year: 2025).*

(Continued)

*Primary Examiner* — Timothy J Thompson
*Assistant Examiner* — John B Freal
(74) *Attorney, Agent, or Firm* — Winston Hsu (57) ABSTRACT

A board-level pad pattern includes a corner pad unit disposed at a corner of a surface mount region for mounting a multi-row QFN package. The corner pad unit includes at least a reversed-L-shaped pad. The reversed-L-shaped pad is disposed in proximity to an apex of the corner of the surface mount region.

20 Claims, 7 Drawing Sheets

(56) References Cited

U.S. PATENT DOCUMENTS

| | | |
|---|---|---|
| 2003/0197251 A1 | 10/2003 | Nakamura |
| 2004/0004296 A1 | 1/2004 | Cheng |
| 2005/0040539 A1 | 2/2005 | Carlsgaard |
| 2006/0232301 A1 | 10/2006 | Morlion |
| 2007/0096338 A1 | 5/2007 | Kim |
| 2007/0187808 A1 | 8/2007 | Mihelcic |
| 2008/0012645 A1 | 1/2008 | Ichitsubo |
| 2008/0048319 A1 | 2/2008 | Ahn |
| 2008/0093749 A1 | 4/2008 | Gerber |
| 2009/0166620 A1 | 7/2009 | Maede |
| 2009/0301764 A1 | 12/2009 | Kawamura |
| 2009/0302451 A1 | 12/2009 | Matsubara |
| 2010/0001392 A1 | 1/2010 | Cho |
| 2010/0007008 A1* | 1/2010 | Sano ............... H05K 3/3436 257/692 |
| 2010/0078800 A1 | 4/2010 | Aboush |
| 2010/0133535 A1 | 6/2010 | Ojiro |
| 2012/0007195 A1 | 1/2012 | Zhao |
| 2012/0273972 A1 | 11/2012 | Kawai |
| 2013/0292815 A1 | 11/2013 | Tashiro |
| 2014/0027919 A1 | 1/2014 | Nakayama |
| 2014/0070402 A1* | 3/2014 | Chuang ............... H01L 21/563 257/737 |
| 2014/0099123 A1 | 4/2014 | Kang |
| 2014/0193954 A1 | 7/2014 | Taoka |
| 2015/0041985 A1 | 2/2015 | Hsieh |
| 2015/0115454 A1 | 4/2015 | Magnus |
| 2015/0145132 A1 | 5/2015 | Ramakrishnan |
| 2015/0325543 A1 | 11/2015 | Katkar |
| 2016/0119564 A1* | 4/2016 | Suzuki ............... H05K 1/117 348/294 |
| 2016/0131340 A1* | 5/2016 | Zanon ............... F21V 19/0025 361/767 |
| 2016/0248140 A1 | 8/2016 | Zhang |
| 2019/0318990 A1 | 10/2019 | Nakagawa |
| 2020/0196449 A1 | 6/2020 | Gera |
| 2020/0402893 A1 | 12/2020 | Chang |
| 2021/0233865 A1 | 7/2021 | Tarui |
| 2022/0157705 A1 | 5/2022 | Yin |
| 2022/0415844 A1 | 12/2022 | Tang |
| 2024/0251610 A1 | 7/2024 | Dong |

FOREIGN PATENT DOCUMENTS

| | | |
|---|---|---|
| EP | 4 096 371 A1 | 11/2022 |
| JP | 10-74790 A | 3/1998 |
| JP | 2004-77386 A | 3/2004 |
| JP | 2007-294768 A | 11/2007 |
| JP | 2011-114071 A | 6/2011 |
| JP | 2021-28927 A | 2/2021 |
| TW | I741898 B * | 12/2020 |
| WO | 2020/196752 A1 | 10/2020 |
| WO | 2021/179504 A1 | 9/2021 |

OTHER PUBLICATIONS

Tang, the specification, including the claims, and drawings in the U.S. Appl. No. 18/078,022, filed Dec. 8, 2022.
Tang, the specification, including the claims, and drawings in the U.S. Appl. No. 18/076,373, filed Dec. 6, 2022.

* cited by examiner

BOARD-LEVEL PAD PATTERN FOR MULTI-ROW QFN PACKAGES

CROSS REFERENCE TO RELATED APPLICATIONS

This application claims the benefit of U.S. Provisional Application No. 63/296,011, filed on Jan. 3, 2022. The content of the application is incorporated herein by reference.

BACKGROUND

The present disclosure relates to ball pad (or finger pad) layout of a base substrate. More particularly, the present disclosure relates to a board-level ball pad pattern for multi-row Quad Flat No lead (QFN) packages.

The continuous advancement in technology and miniaturization of electronic components, hand held and communication devices require superior thermal-electrical performance and miniature packages. An advanced and complicated Integrated Circuit (IC) device often demands increase in number of I/O's while maintaining its small size, footprint and weight. A dual-row QFN is an ideal solution for such demanding applications.

The multi-row QFN package is a plastic-encapsulated package with a copper leadframe substrate. The exposed die attach paddle on the bottom efficiently conducts heat to the PCB and provides a stable ground through down bonds or by electrical connections through conductive die attach material. The design of multi-row QFN packages allows for flexibility and enhances electrical performance to very high-speed operating frequencies.

As known in the art, differential signaling has been employed on PCB routing for the multi-row QFN packages, which uses two complementary signals to transmit the one data signal, but the second signal is inverted from the first. The signal receiver uses the difference between the inverted and non-inverted signals to decipher the information. Using differential pair routing to transmit signals has benefits such as reduction in noise and EMI. However, the drawback is that it takes up more space.

Further, to get the best performance out of the differential pair routing, the lines must be equal in length and the pairs must be routed together and at the same widths, which can be a problem when routing around obstacles on the circuit board such as vias or smaller components.

It is known that temperature variation induces strengths between the different substrates due to their different coefficient of thermal expansion (CTE). As a result of both material property and geometric factors these strengths generate creep strain energy and fatigues on the different layers in the structure and on the soldering joints. Simulations performed with different QFN package options and with a number of thermal cycling conditions predict that the critical region is at the interface between pads located in the package corners and soldering material below pads.

SUMMARY

One object of the present invention is to provide an improved board-level ball pad pattern for multi-row QFN packages in order to solve the above-mentioned prior art problems or shortcomings.

One aspect of the invention provides a board-level pad pattern including a corner pad unit disposed at a corner of a surface mount region for mounting a multi-row QFN package. The corner pad unit comprises at least a reversed-L-shaped pad. The reversed-L-shaped pad is disposed in proximity to an apex of the corner of the surface mount region.

According to some embodiments, two edges of the reversed-L-shaped pad are perpendicular to two adjacent sides of the surface mount region, respectively.

According to some embodiments, two edges of the reversed-L-shaped pad are parallel with two adjacent sides of the surface mount region, respectively.

According to some embodiments, the board-level pad pattern further includes three square-shaped pads disposed around the reversed-L-shaped pad, thereby forming a 2×2 corner ball pad array.

According to some embodiments, spacing between the reversed-L-shaped pad and the three square-shaped pads is equal to or greater than 0.18 mm.

According to some embodiments, the reversed-L-shaped pad and the three square-shaped pads are ground pads.

According to some embodiments, the reversed-L-shaped pad and the three square-shaped pads are dummy pads.

According to some embodiments, a solder paste is disposed on each of the three square-shaped pads, wherein the solder paste presents a rounded corner.

According to some embodiments, the board-level pad pattern further includes a square-shaped pad diagonally disposed around the reversed-L-shaped pad and two signal pads, thereby forming a 2×2 corner ball pad array.

According to some embodiments, the reversed-L-shaped pad and the square-shaped pad are ground pads.

According to some embodiments, the reversed-L-shaped pad and the square-shaped pad are dummy pads.

According to some embodiments, a solder paste is disposed on the square-shaped pad, wherein the solder paste presents a rounded corner.

According to some embodiments, the board-level pad pattern further includes two square-shaped pads diagonally disposed around the reversed-L-shaped pad and another reversed-L-shaped pad, thereby forming a 2×2 corner ball pad array.

According to some embodiments, the reversed-L-shaped pads and the square-shaped pads are ground pads.

According to some embodiments, the reversed-L-shaped pads and the square-shaped pads are dummy pads.

According to some embodiments, a solder paste is disposed on the square-shaped pad, wherein the solder paste presents a rounded corner.

According to some embodiments, the board-level pad pattern further includes two signal pads diagonally disposed around the reversed-L-shaped pad and another reversed-L-shaped pad, thereby forming a 2×2 corner ball pad array.

According to some embodiments, the reversed-L-shaped pads are ground pads.

According to some embodiments, the reversed-L-shaped pads are dummy pads.

Another aspect of the invention provides a semiconductor device including a base substrate comprising a surface mount region, wherein a corner pad unit is disposed at a corner of the surface mount region, wherein the corner pad unit comprises at least a reversed-L-shaped pad, wherein the reversed-L-shaped pad is disposed in proximity to an apex of the corner of the surface mount region; and a multi-row QFN package mounted on the surface mount region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
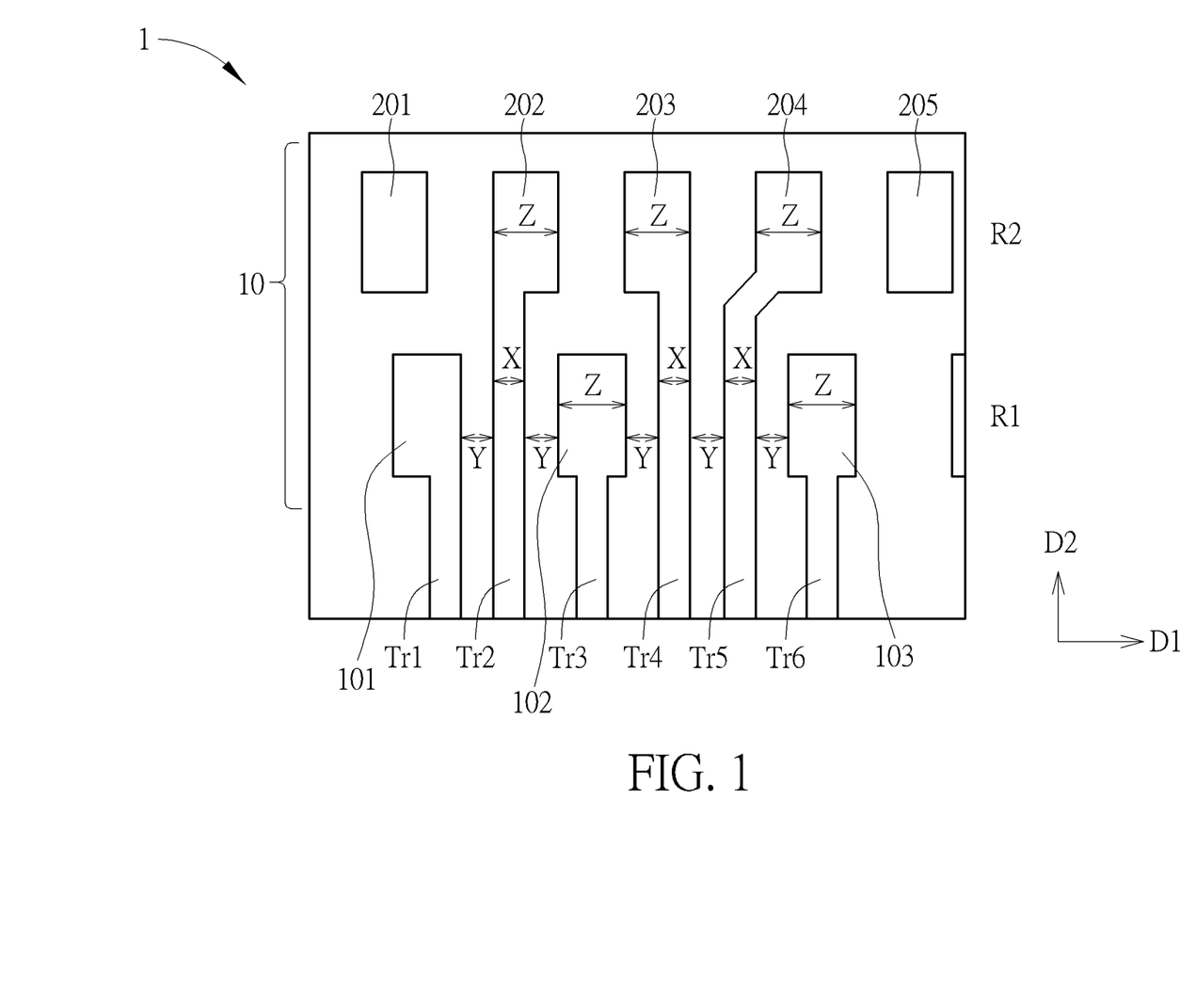
FIG. 1 shows a germane portion of an exemplary base top layer of a layout of ball pads for a multi-row QFN package according to one embodiment of the invention.
Figure 2:
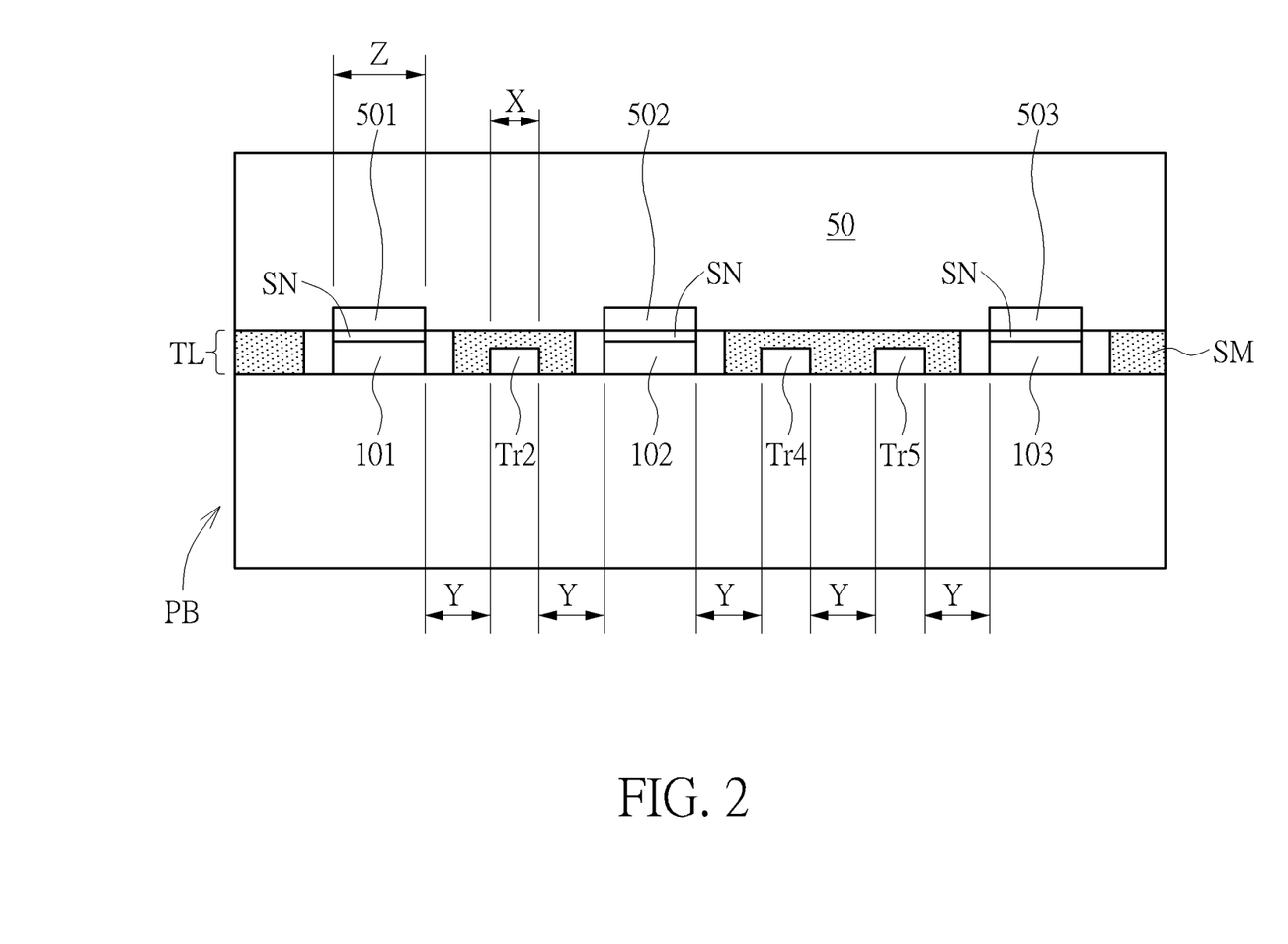
FIG. 2 is a schematic, cross-sectional diagram taken along line I-I' in FIG. 1 after the assembly of the multi-row QFN package.

FIG. 1 is a schematic diagram showing a germane portion of an exemplary base top layer of a layout of ball pads for a multi-row QFN package according to one embodiment of the invention. FIG. 2 is a schematic, cross-sectional diagram taken along line I-I' in FIG. 1 after the assembly of the multi-row QFN package. As shown in FIG. 1 and FIG. 2, the ball pad layout 1 fabricated in the top layer TL of a base substrate PB comprises staggered ball pads (or finger pads) including, for example, ball pads 101-103 arranged in the first row R1 and ball pads 201-205 arranged in the second row R2. According to an embodiment of the invention, for example, the ball pads 101-103 and 201-205 may be copper pads, but is not limited thereto. The base substrate PB may comprise a printed circuit board or a package substrate, but is not limited thereto.

According to an embodiment of the invention, the ball pads 101-103 and 201-205 are disposed within a surface mount region 10 for mounting a multi-row QFN package 50 (FIG. 2) using surface mount techniques known in the art. The leads 501-503 on the bottom side of the r multi-row QFN package 50 may be bonded to corresponding ball pads 101-103 and 201-205 with solder joints SN to form electrical connection paths. According to an embodiment of the invention, for example, the ball pads 101-103 and 201-205 may be non-solder mask defined (NSMD) pads. For the sake of simplicity, the solder mask is omitted in FIG. 1.

According to an embodiment of the invention, the ball pads 101-103 arranged in the first row R1 are approximately aligned to one another along the first direction D1. According to an embodiment of the invention, the ball pads 201-205 arranged in the second row R2 are approximately aligned to one another along the first direction D1. According to an embodiment of the invention, the ball pads 101-103 and 201-205 may be arranged in a staggered manner in the second direction D2 that is orthogonal to the first direction D1.

According to an embodiment of the invention, for example, the ball pad 101 may be connected to a trace Tr1, the ball pad 202 may be connected to a trace Tr2, the ball pad 102 may be connected to a trace Tr3, the ball pad 203 may be connected to a trace Tr4, the ball pad 204 may be connected to a trace Tr5, and the ball pad 103 may be connected to a trace Tr6. According to an embodiment of the invention, for example, the traces Tr1-Tr6 may extend along the second direction D2.

According to an embodiment of the invention, for example, only the trace Tr2 passes through the routing space between the ball pad 101 and ball pad 102 in the first row R1. According to an embodiment of the invention, for example, the two adjacent traces Tr4 and Tr5 pass through the routing space between the ball pad 102 and ball pad 103 in the first row R1. According to an embodiment of the invention, for example, the traces Tr4 and Tr5 are designated as a differential pair, and the adjacent balls pads 103 and 103 are designated as ground pads, thereby constituting a ground-signal-signal-ground (GSSG) routing configuration. In FIG. 1, the width of each of the ball pads 101-103 and 201-205 is labeled as Z, the width of each of the traces Tr1-Tr6 is labeled as X, and the space between the passing traces Tr2, Tr4 and Tr5 and the ball pads 101-103 is labeled as Y.

Figure 3:
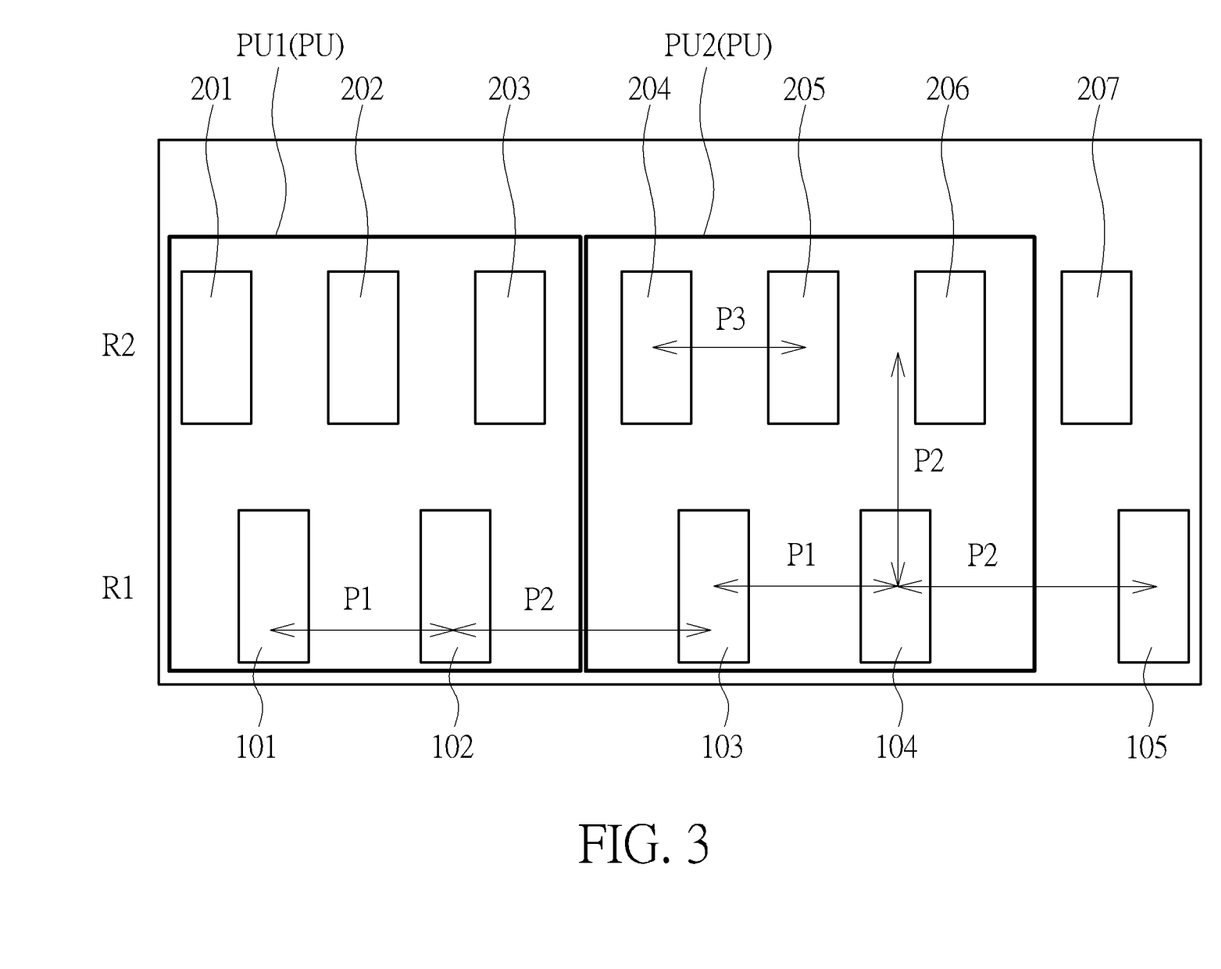
FIG. 3 schematically shows the partial ball pad layout for a multi-row QFN package and the pad pitches according to an embodiment of the invention.

FIG. 3 schematically shows the partial layout of the ball pads and the pad pitches according to an embodiment of the invention. For the sake of simplicity, the solder mask and the traces are omitted in FIG. 3. As shown in FIG. 3, according to an embodiment of the invention, the ball pads 101-105 in the first row R1 are arranged at two different pitches P1 and P2, for example, P1=0.5 mm and P2=0.7 mm. According to an embodiment of the invention, P1=X+2Y+Z and P2=2X+3Y+Z. According to an embodiment of the invention, for example, the ball pads 201-205 in the second row R2 are arranged at a constant pitch P3 of about 0.4 mm, which is equal to the width Z of each of the ball pads 101-105 plus the interval of two adjacent ball pads of about 0.18-0.2 mm (P3=Z+V, where V=0.18-0.2 mm). According to an embodiment of the invention, for example, the width Z of each of the ball pads 101-105 is 0.2 mm. The first row R1 and the second row R2 are arranged with pitch P2.

FIG. 3 also illustrates a basic pad unit PU consisting of five pads. For example, the basic pad unit PU1 is composed of two ball pads 101 and 102 in the first row R1 and three ball pads 201-203 in the second row R2, and the next basic pad unit PU2 is composed of two ball pads 103 and 104 in the first row R1 and three ball pads 204-206 in the second row R2. The array of the ball pads for the multi-row QFN is constructed by repeating the basic pad units PU.

It is advantageous to use the present invention because the number of the ball pads can be increased by 4.5% for a 12.7 mm×12.7 mm dual-row QFN package (from 176 pins to 186 pins). Alternatively, the size of the dual-row QFN package can be reduced by 7.7% for a 176-pin dual-row QFN package (from 12.7 mm×12.7 mm to 12.2 mm×12.2 mm). Further, it is easier to assign the differential pair when routing the layout for the multi-row QFN packages.

FIG. 4A to FIG. 4D illustrate a corner pad unit composed of a single, reversed-L-shaped pad and three square-shaped pads according to an embodiment of the invention. As shown in FIG. 4A to FIG. 4D, the reversed-L-shaped pad 401 is disposed at the location that is closest to the apex A of a corner of the surface mount region 10. The two edges of the reversed-L-shaped pad 401 may be perpendicular to the two adjacent sides of the surface mount region 10, respectively, as that shown in FIG. 4A and FIG. 4B. Alternatively, the two edges of the reversed-L-shaped pad 401 may be parallel with the two adjacent sides of the surface mount region 10, respectively, as that shown in FIG. 4C and FIG. 4D. The three square-shaped pads 402-404 are disposed around the reversed-L-shaped pad 401, thereby forming a 2×2 corner ball pad array, which can significantly improve the ball cracking problems.

According to an embodiment, for example, the spacing between the pads 401-404 may be equal to or greater than 0.18 mm, but is not limited thereto. According to an embodiment, the pads 401-404 may be dummy pads. According to an embodiment, the pads 401-404 may be ground pads and may be electrically connected to a ground plane of the PCB substrate.

Figure 4A:
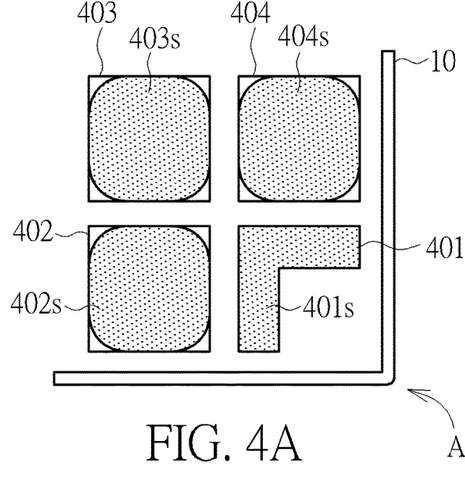
FIG. 4A to FIG. 4D illustrate a corner pad unit composed of a single, reversed-L-shaped pad and three square-shaped pads according to an embodiment of the invention.
Figure 4B:
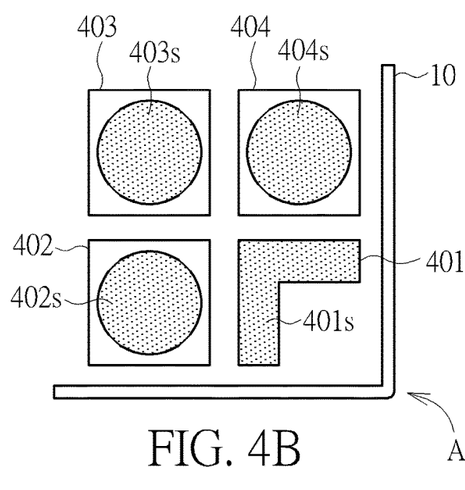
Figure 4C:
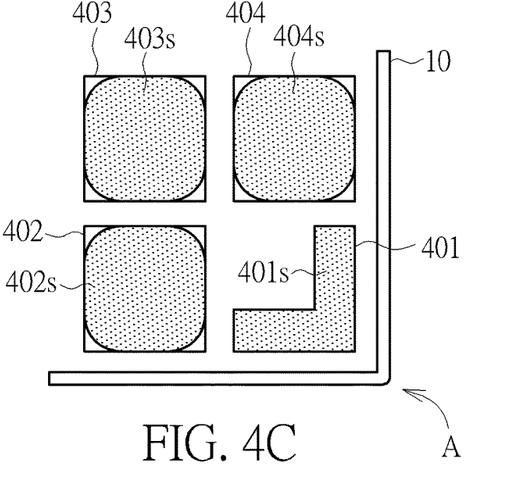
Figure 4D:
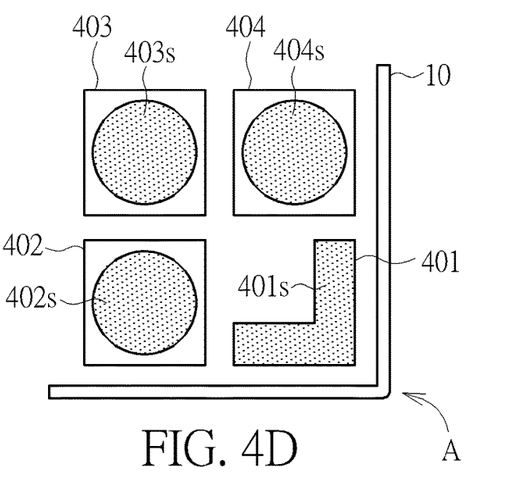

According to an embodiment, solder paste 401s, solder paste 402s, solder paste 403s, and solder paste 404s may be applied onto the respective pads 401-404 by using a screen printing method. In FIG. 4A and FIG. 4C, when viewed from the above, the solder paste 402s, solder paste 403s, and solder paste 404s present a rounded corner corresponding to each corner of the square-shaped pads 402-404. In FIG. 4B and FIG. 4D, compared to the embodiments in FIG. 4A and FIG. 4C, the solder paste 402s, solder paste 403s, and solder paste 404s occupy less surface area of each of the pads 402-404, and each of the solder paste 402s, solder paste 403s, and solder paste 404s presents a circular shape approximately about the center of each of the pads 402-404. In FIG. 4A to FIG. 4D, the reversed-L-shaped pad 401 is completely covered with the solder paste 401s. By providing such rounded corners or circular shape of the solder paste 402s, solder paste 403s, and solder paste 404s, the SMT stability and solder joint reliability can be improved.

FIG. 5A to FIG. 5D illustrate a corner pad unit composed of a single, reversed-L-shaped pad, two signal pads, and one square-shaped pad according to another embodiment of the invention. As shown in FIG. 5A to FIG. 5D, likewise, the reversed-L-shaped pad 501 is disposed at the location that is closest to the apex A of a corner of the surface mount region 10. The two edges of the reversed-L-shaped pad 501 may be perpendicular to the two sides of the surface mount region 10, respectively, as that shown in FIG. 5A and FIG. 5B. Alternatively, the two edges of the reversed-L-shaped pad 501 may be parallel with the two sides of the surface mount region 10, respectively, as that shown in FIG. 5C and FIG. 5D. The square-shaped pad 503 is disposed diagonally around the reversed-L-shaped pad 501 and the two signal pads 502 and 504 are arranged diagonally, thereby forming a 2×2 corner ball pad array, which can significantly improve the ball cracking problems.

According to an embodiment, for example, the spacing between the pads 501-504 may be equal to or greater than 0.18 mm, but is not limited thereto. According to an embodiment, the pads 501 and 503 may be dummy pads. According to an embodiment, the pads 501 and 503 may be ground pads and may be electrically connected to a ground plane of the PCB substrate.

Figure 5A:
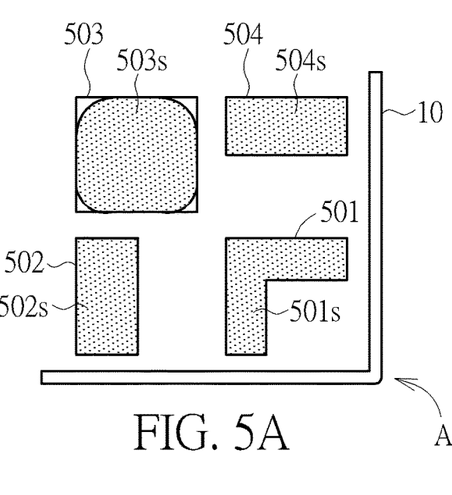
FIG. 5A to FIG. 5D illustrate a corner pad unit composed of a single, reversed-L-shaped pad, two signal pads, and one square-shaped pad according to another embodiment of the invention.
Figure 5B:
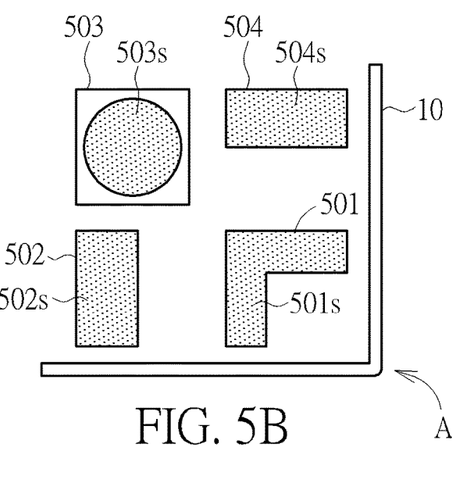
Figure 5C:
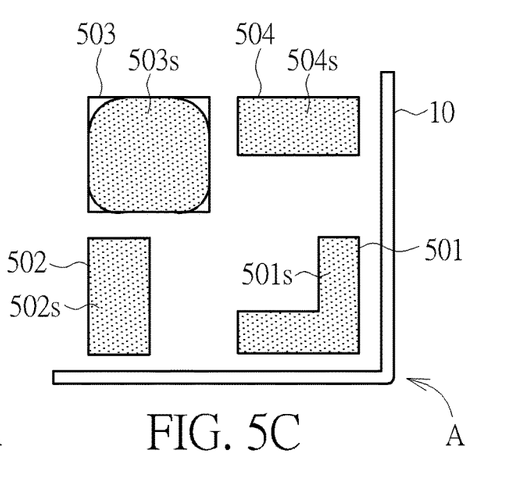
Figure 5D:
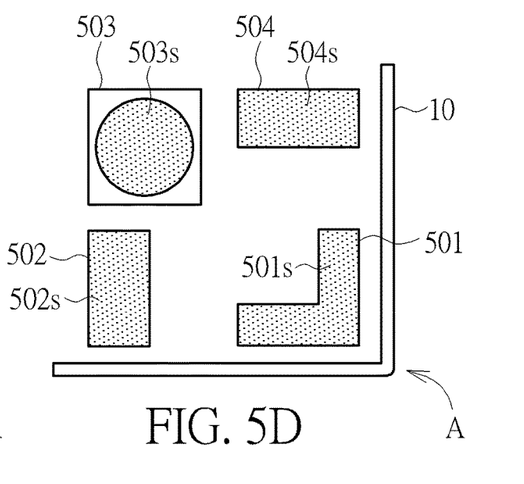

According to an embodiment, solder paste 501s, solder paste 502s, solder paste 503s, and solder paste 504s may be applied onto the respective pads 501-504 by using a screen printing method. In FIG. 5A and FIG. 5C, when viewed from the above, the solder paste 503s presents a rounded corner corresponding to each corner of the pad 503. In FIG. 5B and FIG. 5D, compared to the embodiments in FIG. 5A and FIG. 5C, the solder paste 503s occupies less surface area of the pad 503, and the solder paste 503s presents a circular shape about the center of the pad 503. In FIG. 5A to FIG. 5D, the reversed-L-shaped pad 501 and the two signal pads 502 and 504 are completely covered with the solder paste 501s, 502s, and 504s, respectively.

FIG. 6A to FIG. 6D illustrate a corner pad unit composed of two reversed-L-shaped pads and two square-shaped pads according to still another embodiment of the invention. As shown in FIG. 6A to FIG. 6D, the reversed-L-shaped pad 601 is disposed at the location that is closest to the apex A of a corner of the surface mount region 10. The two edges of the reversed-L-shaped pad 601 may be perpendicular to the two sides of the surface mount region 10, respectively, as that shown in FIG. 6A and FIG. 6B. Alternatively, the two edges of the reversed-L-shaped pad 601 may be parallel with the two sides of the surface mount region 10, respectively, as that shown in FIG. 6C and FIG. 6D. The reversed-L-shaped pad 603 is disposed diagonally around the reversed-L-shaped pad 601 and the two square-shaped pads 602 and 604 are arranged diagonally, thereby forming a 2×2 corner ball pad array, which can significantly improve the ball cracking problems.

According to an embodiment, for example, the spacing between the pads 601-604 may be equal to or greater than 0.18 mm, but is not limited thereto. According to an embodiment, the pads 601-604 may be dummy pads. According to an embodiment, the pads 601-604 may be ground pads and may be electrically connected to a ground plane of the PCB substrate.

Figure 6A:
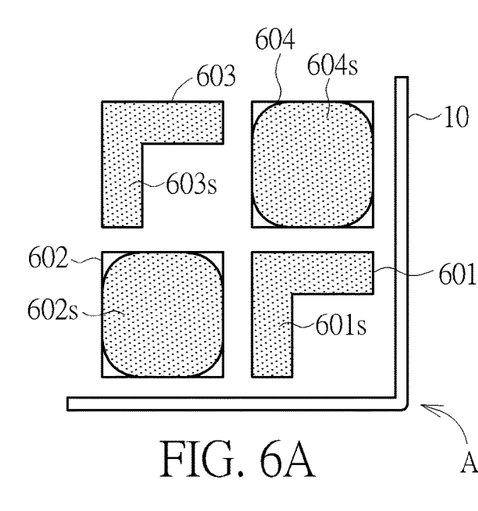
FIG. 6A to FIG. 6D illustrate a corner pad unit composed of two reversed-L-shaped pads and two square-shaped pads according to still another embodiment of the invention.
Figure 6B:
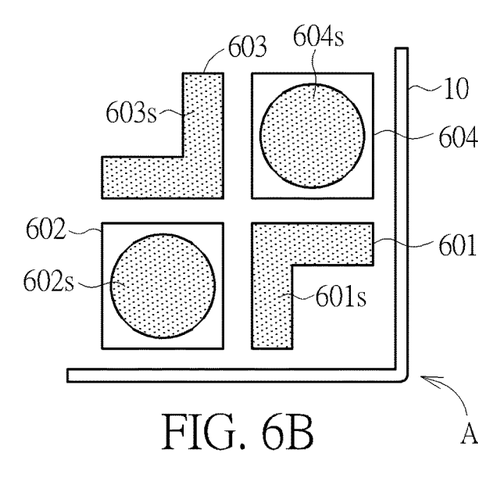
Figure 6C:
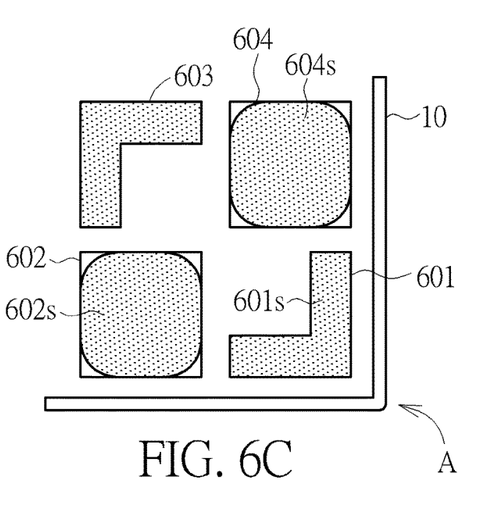
Figure 6D:
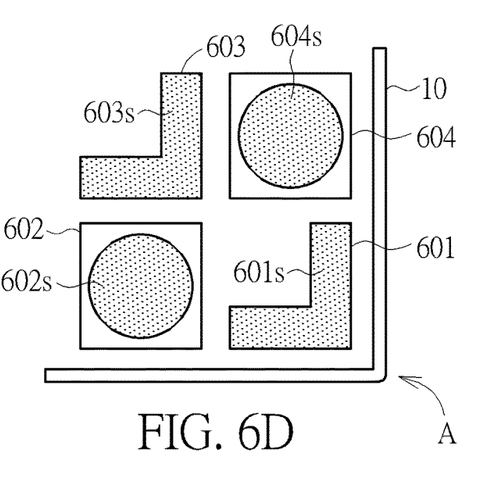
Figure 7A:
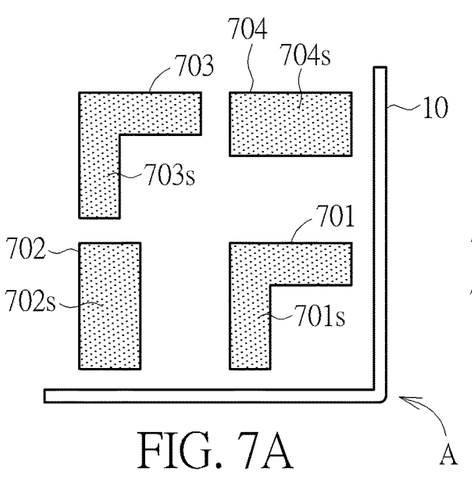
FIG. 7A to FIG. 7D illustrate a corner pad unit composed of two reversed-L-shaped pads and two signal pads according to yet another embodiment of the invention.
Figure 7B:
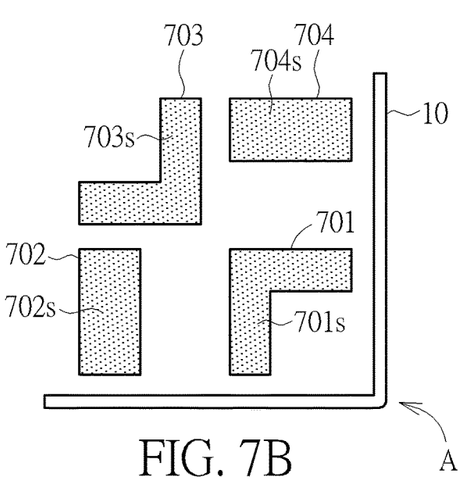
Figure 7C:
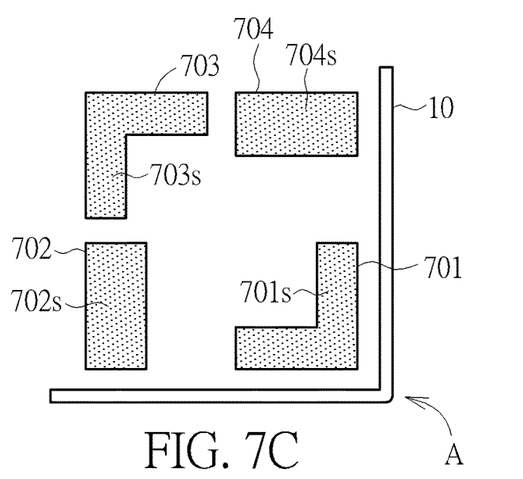
Figure 7D:
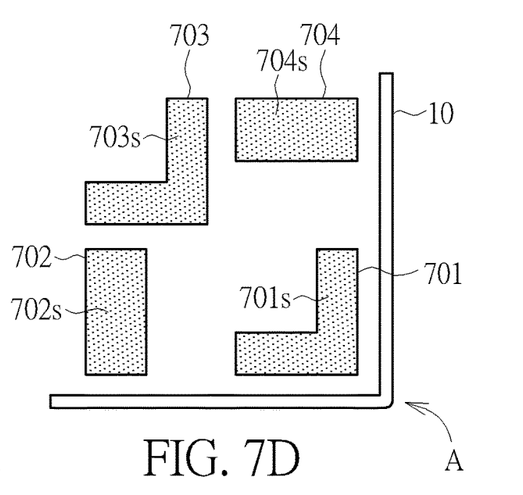

According to an embodiment, solder paste 601s, solder paste 602s, solder paste 603s, and solder paste 604s may be applied onto the respective pads 601-604 by using a screen printing method. In FIG. 6A and FIG. 6C, when viewed from the above, each of the solder paste 602s and solder paste 604s presents a rounded corner corresponding to each corner of the pads 602 and 604. In FIG. 6B and FIG. 6D, compared to the embodiments in FIG. 6A and FIG. 6C, each of the solder paste 602s and solder paste 604s occupies less surface area of each of the pads 602 and 604. Each of the solder paste 602s and solder paste 604s presents a circular shape about the center of each of the pads 602 and 604. In FIG. 6A to FIG. 6D, the reversed-L-shaped pads 601 and 603 are completely covered with the solder paste 601s and 603s, respectively.

FIG. 7A to FIG. 7D illustrate a corner pad unit composed of two reversed-L-shaped pads and two signal pads according to yet another embodiment of the invention. As shown in FIG. 7A to FIG. 7D, the reversed-L-shaped pad 701 is disposed at the location that is closest to the apex A of a corner of the surface mount region 10. The two edges of the reversed-L-shaped pad 701 may be perpendicular to the two sides of the surface mount region 10, respectively, as that shown in FIG. 7A and FIG. 7B. Alternatively, the two edges of the reversed-L-shaped pad 701 may be parallel with the two sides of the surface mount region 10, respectively, as that shown in FIG. 7C and FIG. 7D. The reversed-L-shaped pad 703 is disposed diagonally around the reversed-L-shaped pad 701 and the two signal pads 702 and 704 are arranged diagonally, thereby forming a 2×2 corner ball pad array, which can significantly improve the ball cracking problems.

According to an embodiment, for example, the spacing between the pads 701-704 may be equal to or greater than 0.18 mm, but is not limited thereto. According to an embodiment, the pads 701 and 703 may be dummy pads. According to an embodiment, the pads 701 and 703 may be ground pads and may be electrically connected to a ground plane of the PCB substrate.

According to an embodiment, solder paste 701s, solder paste 702s, solder paste 703s, and solder paste 704s may be applied onto the respective pads 701-704 by using a screen printing method. In FIG. 7A to FIG. 7D, the pads 701-704 are completely covered with the solder pastes 701s-704s, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A board-level pad pattern, comprising:
    a plurality of staggered ball pads disposed within a surface mount region for mounting a multi-row QFN package, wherein the plurality of staggered ball pads comprises first ball pads arranged in a first row and second ball pads arranged in a second row, wherein the first ball pads in the first row are arranged at two different pitches, and the second ball pads in the second row are arranged at a constant pitch;
    a basic pad unit consisting of five pads composed of two of the first ball pads in the first row and three of the second ball pads in the second row, wherein an array of the plurality of staggered ball pads within the surface mount region for the multi-row QFN is constructed by repeating the basic pad units; and
    a corner pad unit disposed at a corner of the surface mount region for mounting a multi-row QFN package, wherein the corner pad unit comprises at least a reversed-L-shaped pad, wherein the reversed-L-shaped pad is disposed in proximity to an apex of the corner of the surface mount region.

2. The board-level pad pattern according to claim 1, wherein two edges of the reversed-L-shaped pad are perpendicular to two adjacent sides of the surface mount region, respectively.

3. The board-level pad pattern according to claim 1, wherein two edges of the reversed-L-shaped pad are parallel with two adjacent sides of the surface mount region, respectively.

4. The board-level pad pattern according to claim 1 further comprising:
    three square-shaped pads disposed around the reversed-L-shaped pad, thereby forming a 2×2 corner ball pad array.

5. The board-level pad pattern according to claim 4, wherein spacing between the reversed-L-shaped pad and the three square-shaped pads is equal to or greater than 0.18 mm.

6. The board-level pad pattern according to claim 4, wherein the reversed-L-shaped pad and the three square-shaped pads are ground pads.

7. The board-level pad pattern according to claim 4, wherein the reversed-L-shaped pad and the three square-shaped pads are dummy pads.

8. The board-level pad pattern according to claim 4, wherein a solder paste is disposed on each of the three square-shaped pads, wherein the solder paste presents a rounded corner.

9. The board-level pad pattern according to claim 1 further comprising:
    a square-shaped pad diagonally disposed around the reversed-L-shaped pad and two signal pads, thereby forming a 2×2 corner ball pad array.

10. The board-level pad pattern according to claim 9, wherein the reversed-L-shaped pad and the square-shaped pad are ground pads.

11. The board-level pad pattern according to claim 9, wherein the reversed-L-shaped pad and the square-shaped pad are dummy pads.

12. The board-level pad pattern according to claim 9, wherein a solder paste is disposed on the square-shaped pad, wherein the solder paste presents a rounded corner.

13. The board-level pad pattern according to claim 1 further comprising:
    two square-shaped pads diagonally disposed around the reversed-L-shaped pad and another reversed-L-shaped pad, thereby forming a 2×2 corner ball pad array.

14. The board-level pad pattern according to claim 13, wherein the reversed-L-shaped pads and the square-shaped pads are ground pads.

15. The board-level pad pattern according to claim 13, wherein the reversed-L-shaped pads and the square-shaped pads are dummy pads.

16. The board-level pad pattern according to claim 13, wherein a solder paste is disposed on the square-shaped pad, wherein the solder paste presents a rounded corner.

17. The board-level pad pattern according to claim 1 further comprising:
    two signal pads diagonally disposed around the reversed-L-shaped pad and another reversed-L-shaped pad, thereby forming a 2×2 corner ball pad array.

18. The board-level pad pattern according to claim 17, wherein the reversed-L-shaped pads are ground pads.

19. The board-level pad pattern according to claim 17, wherein the reversed-L-shaped pads are dummy pads.

20. A semiconductor device, comprising:
    a base substrate comprising a surface mount region;
    a plurality of staggered ball pads disposed within the surface mount region, wherein the plurality of staggered ball pads comprises first ball pads arranged in a first row and second ball pads arranged in a second row, wherein the first ball pads in the first row are arranged at two different pitches, and the second ball pads in the second row are arranged at a constant pitch;

a basic pad unit consisting of five pads composed of two of the first ball pads in the first row and three of the second ball pads in the second row, wherein an array of the plurality of staggered ball pads within the surface mount region is constructed by repeating the basic pad units;

a corner pad unit disposed at a corner of the surface mount region, wherein the corner pad unit comprises at least a reversed-L-shaped pad, wherein the reversed-L-shaped pad is disposed in proximity to an apex of the corner of the surface mount region; and a multi-row QFN package mounted on the surface mount region.

* * * * *